US006979609B2

(12) United States Patent
Post et al.

(10) Patent No.: US 6,979,609 B2
(45) Date of Patent: Dec. 27, 2005

(54) METHOD OF FABRICATING MOSFET TRANSISTORS WITH MULTIPLE THRESHOLD VOLTAGES BY HALO COMPENSATION AND MASKS

(75) Inventors: Ian R. Post, Portland, OR (US); Kaizad Mistry, Lake Oswego, OR (US)

(73) Assignee: Intel Corporation, Santa Clara, CA (US)

( * ) Notice: Subject to any disclaimer, the term of this patent is extended or adjusted under 35 U.S.C. 154(b) by 440 days.

(21) Appl. No.: 10/426,221

(22) Filed: Apr. 30, 2003

(65) Prior Publication Data

US 2003/0203579 A1    Oct. 30, 2003

Related U.S. Application Data

(63) Continuation of application No. 10/038,216, filed on Jan. 2, 2002, now Pat. No. 6,586,294.

(51) Int. Cl.[7] .......................................... H01L 21/8238
(52) U.S. Cl. ...................... 438/217; 438/237; 438/276; 438/289
(58) Field of Search ............................. 438/217–219, 438/223–228, 237, 296, 276, 289, 224, 231; 257/391, 392, 371

(56) References Cited

U.S. PATENT DOCUMENTS

| 5,747,855 | A | | 5/1998 | Dennison et al. |
| 5,789,788 | A | * | 8/1998 | Ema et al. .................. 257/371 |
| 6,096,611 | A | | 8/2000 | Wu |
| 6,258,645 | B1 | * | 7/2001 | Kang .......................... 438/224 |
| 6,426,261 | B1 | | 7/2002 | Fujii et al. |

* cited by examiner

Primary Examiner—Michael Lebentritt
Assistant Examiner—Yennhu B Huynh
(74) Attorney, Agent, or Firm—Blakely, Sokoloff, Taylor & Zafman LLP

(57) ABSTRACT

A method for processing dual threshold nMOSFETs and pMOSFETs requiring only one additional masking and implantation operation over single threshold MOSFETs is disclosed. The additional mask and implant operation both enhances the threshold voltage doping of one type of FET and compensates the threshold voltage doping of another type of FET. Where a first threshold voltage implant sets the threshold voltage for an NMOS device to a low threshold voltage, and a second threshold voltage implant sets the threshold voltage for a PMOS device to a high threshold voltage, a third implant may both enhance a NMOS device threshold implant to set the threshold voltage high while compensating a PMOS device threshold implant to set the threshold voltage low.

6 Claims, 3 Drawing Sheets

METHOD OF FABRICATING MOSFET TRANSISTORS WITH MULTIPLE THRESHOLD VOLTAGES BY HALO COMPENSATION AND MASKS

CROSS REFERENCE TO RELATED APPLICATION

This application is a continuation of U.S. application Ser. No. 10/038,216, filed Jan. 2, 2002 now U.S. Pat. No. 6,586,294, entitled "A Method of Fabricating MOSFET Transistors with Multiple Threshold Voltages by Halo Compensation and Masks."

BACKGROUND

1. Field

The invention relates generally to complementary metal oxide semiconductor (CMOS) processing. CMOS circuits typically comprise n-type metal oxide semiconductor (NMOS) devices combined with p-type metal oxide semiconductor (PMOS) devices. Transistors made from NMOS and PMOS devices are typically referred to as metal oxide semiconductor field effect transistor (MOSFET) devices. More specifically, the invention relates to use of a single halo implantation to compensate the threshold voltage of a low threshold voltage transistor and enhance the threshold voltage of a high threshold voltage transistor to provide dual high and low threshold voltage for both NMOS and PMOS transistors.

2. Background

Threshold voltage generally means the lowest gate voltage required to permit current to pass from a source to a drain in an insulated gate field effect transistor (FET). Threshold voltage is thus the level of voltage required to turn the transistor on. Threshold voltage is important because if it is too low, it is possible to suffer off state leakage.

Off state leakage is leakage current that occurs when the transistor is turned off. If zero volts are placed on the gate of the transistor, nominally, the transistor should be off and zero current should flow. If the gate is at zero volts, there is no inversion region and there should be no current. The source and drain should be like two back-to-back diodes. There may be a small amount of diode leakage, of course, particularly where the source and the drain are close together. There may be a certain amount depletion region extending from the source and the drain towards each other, because the critical dimension of the transistor, i.e., the gate length is reduced. If these depletion regions overlap, they may create source to drain leakage. The merging of these depletion regions may be defeated by an implant strengthening the depletion region beneath the gate. One side effect of such an implant is to raise the voltage required to turn the gate on, or raise the threshold voltage of the transistor.

One of the ways to dope the region under the gate between the source and drain to defeat off state leakage is called a halo implant. The halo implant, as is well known in the art, is an implant that is typically directed at the surface of the integrated circuit at an angle off the normal of 0° to 60°. In terms of a wafer fabrication technique, the halo implant is typically directed at the wafer from four different directions. For example, the implant could be directed at the wafer from the lateral directions (e.g. right and left direction) and the top and bottom direction. The implant typically will be directed at the gate from a direction over the source and another from over the direction of the drain. The implants from the right and left direction may take care of all transistors oriented in a single direction. Typically, however, there are transistors that are oriented 90° from other transistors. Giving these transistors halo implants will require implanting from the top and bottom. Thus, the four-direction implant will give halo implants to all insulated gate field effect transistors that are exposed.

One reason for implanting the halo implant after formation of the transistor is that the critical dimension or gate length of the transistor operates as a control in the variables required to establish threshold voltage. The critical dimension of these transistors varies slightly. However, even this slight variation can affect the threshold voltage boost required by the implant. A slightly longer critical dimension or gate length transistor will need a lower threshold voltage boost because the gate itself is separating the source from the drain leaving a large region between the source and drain which reduces the probability of source drain overlap. The larger critical dimension will also separate the halo implants while a smaller critical dimension transistor would allow more of the halo implants to join each other beneath the gate.

In addition, a source drain extension (SDE) implant is preformed after the gate is fabricated. The SDE implant moves the source and drain regions closer to each other and the gate, than the regular source drain implant by itself would. The limit of the source drain extension implant is typically defined by the critical dimension of the gate, i.e. gate length. Here again, a larger critical dimension keeps the source and drain farther apart, while a smaller CD allows the source and drain to extend closer together. The larger CD gate requires less halo implant beneath it, while a smaller CD gate requires a greater halo implant to control off state leakage. A greater halo implant tends to boost the threshold voltage.

Typically, the halo implantation process requires a procedure of four maskings and implantations in the formation of a dual threshold voltage CMOS circuit. The first masking and implantation is used to expose and implant the high threshold voltage NMOS device. This procedure includes an $n^+$ SDE implant, typically at 0° from the normal of the surface of the wafer and a p halo implant. The next masking step uncovers the low threshold voltage NMOS transistor which would require an $n^+$ SDE and a lower dose $p^-$ halo implant. The third masking and implantation operation would fabricate the high threshold voltage PMOS transistor and would entail a $p^+$ SDE implantation at 0° from the normal of the surface of the wafer and an n halo implantation. The final masking operation would fabricate the low threshold voltage PMOS and would require a $p^+$ SDE normal implantation and an $n^-$ halo implantation. The difficulty with four masking and implantation operations is the increased cost and process complexity.

BRIEF DESCRIPTION OF THE DRAWINGS

The invention is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

DETAILED DESCRIPTION

Figure 1:
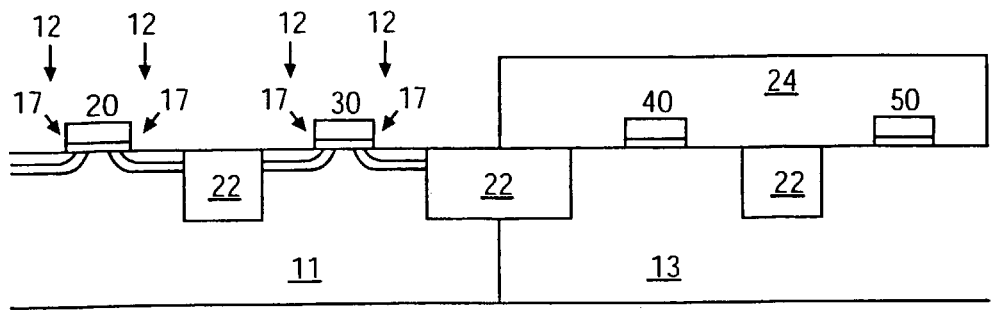
FIG. 1 is a schematic cross-sectional side view of one implantation operation for fabricating a low threshold voltage NMOS transistor.

Reference will now be made to drawings wherein like structures will be provided with like reference designations. In order to show the structures of the claims most clearly, the drawings included herein are diagrammatic representations of integrated circuit structures. Thus, the actual appearance of the fabricated structures, for example, in a photomicrograph, may appear different while still incorporating the essential structures of the claims. Moreover, the drawings only show the structures necessary to understand the claims. Additional structures known in the art have not been included to maintain the clarity of the drawings.

In one embodiment, a method of fabricating dual threshold voltage CMOS circuits is described. The method includes boosting the threshold voltage of a low threshold voltage NMOS transistor while compensating the threshold voltage of a high threshold voltage PMOS transistor during a halo implantation. Boosting the threshold voltage of a low threshold voltage NMOS transistor, with a sufficient p-type halo implantation dose, tends to increase the threshold voltage creating a high threshold voltage NMOS transistor. Compensating the halo implant of a high threshold voltage PMOS transistor with a p-type halo implantation dose tends to reduce the threshold of the high threshold voltage PMOS transistor and create a low threshold voltage PMOS transistor.

The halo implantation for fabricating the threshold voltage of an NMOS transistor consists of blocking the PMOS transistors off with resist and performing the standard source drain extension to the NMOS which is usually a very low energy and high dose n-type implantation. The resist is about one half micron in thickness. The approximate dose for the source drain extension implantation is $1 \times 10^{14}$ atoms to $5 \times 10^{15}$ atoms with a 1 to 20 thousand electron volt (keV) energy in the implant. Typically, the implanted species is arsenic, but it may be phosphorus or antimony. This type of implantation is usually referred to as an $n^+$ SDE implantation. What this leaves is a very shallow highly doped implant between the gate edges and the source and drain in all of the NMOS transistors. Next, a halo implant is performed. This implant will go into both the high and the low threshold voltage NMOS transistors. Typically for an NMOS transistor, the halo implant is performed using boron or boron difluoride for the implant species. Doses are usually in the $1 \times 10^{13}$ to $1 \times 10^{14}$ atom range. The energy of the implant is approximately 5 to 50 thousand electron volts (keV). Typically the halo implant is directed at the silicon surface at an angle of 0° to 60° to the wafer normal. The halo implant described above is typically referred to as a $p^-$ halo implant.

Next, the source drain extension implant on the PMOS transistors is preformed. The NMOS transistors have resist placed over them so they are not implanted. The resist is about one half micron in thickness. The source drain extension for the PMOS transistors is a low energy boron or boron difluoride implanted with a dose with about $1 \times 10^{14}$ to $5 \times 10^{15}$ at an implant energy of 0.2 to 5 keV. This implantation is referred to as a $p^+$ SDE implantation. Next, a halo implant is performed to establish the high threshold voltage for the PMOS transistors. This implant will go into both the high and the low threshold voltage PMOS transistors. Typically, the atom used to implant is either arsenic or phosphorous. The implant conditions usually are: a dose of $1 \times 10^{13}$ to $1 \times 10^{14}$ at an energy of about 30–150 keV, and an angle of 0° to 60° to the wafer normal. This implantation is referred to as an n halo implant.

Finally, a single mask covers the entire CMOS integrated circuit. Photolithography is used to expose the high threshold voltage NMOS transistors, in order to enhance its halo implant; and the low threshold voltage PMOS transistors, in order to compensate its implant. The low threshold voltage NMOS and the high threshold voltage PMOS transistors will be covered by photoresist. Boron or boron difluoride will be used as the implant species in order to enhance the NMOS transistors threshold voltage. The implant used will be a $p^-$ halo implant. The high threshold voltage NMOS device will derive approximately half of its charge from the first NMOS halo implant and approximately half of its charge from this third halo implant. The low threshold voltage PMOS device will become compensated reducing its threshold voltage from that of the high threshold voltage device. Originally, the PMOS device had its threshold voltage set with an arsenic or phosphorous type implant. Now, with the boron or boron difluoride implant compensating the original implant, the implant setting the threshold voltage will be the difference between the arsenic or phosphorous implant and the boron or boron difluoride implant.

Typically, the choice is made to enhance the NMOS transistors threshold voltage, because the current passing through these devices does not see the difference of the compensated charge, rather it sees the sum of the initial charge and the compensating charge. In contrast, the compensated PMOS transistors sees the total doping in terms of carrier transport and the current scatters off all of the doping ion atoms whether they are arsenic or boron. This means the mobility in the channel is lowered and shows up in a degradation in current. Because of the higher mobility in silicon of n-type carriers, typically the operation of the NMOS transistors is optimized over the operation of the PMOS transistors. The highest processing speed NMOS transistors would be those with the lowest threshold voltage. The second most efficient transistors in the CMOS circuit will be the high threshold voltage NMOS transistors. The PMOS transistors are typically not used for critical path operations. One embodiment of this implantation is shown in FIGS. 1–4.

FIG. 1 illustrates the first implantation operation of the NMOS transistors 20 and 30 in p-well 11. Transistor 20 is the low threshold voltage NMOS transistor. Transistor 30 is the high threshold voltage NMOS transistor. PMOS transistors 40 and 50 in n-well 13 are isolated from the implantation by photoresist layer 24. Isolation regions 22, such as standard trench isolation (STI), separate all of the transistors from one another. A photolithography process operation exposes transistors 20 and 30, which are both NMOS transistors, to implantation. An initial source drain extension implantation 12 is performed on all of the n-type transistors. Source drain implantation 12 is an n+ implantation. After source drain implantation 12 is performed, halo implantation 17 is performed on all of the exposed transistors. In one embodiment, halo implantation 17 is a p− halo implantation. Halo implantation 17 is performed between 0°–60° off the normal of the integrated circuit surface.

Figure 2:
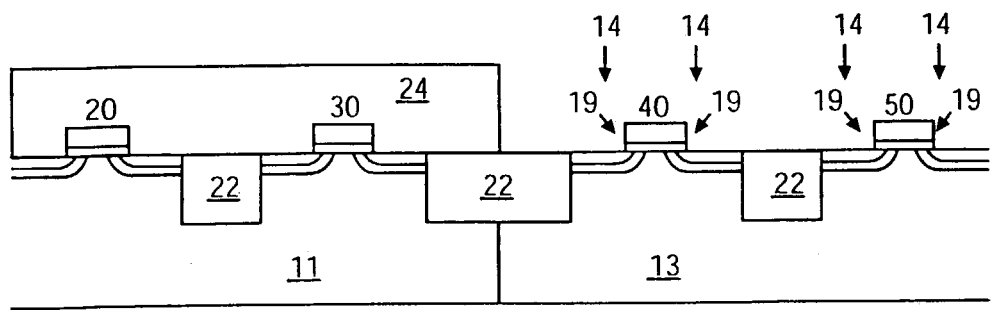
FIG. 2 is a schematic cross-sectional side view of one implantation operation for fabricating a high threshold voltage PMOS transistor.

FIG. 2 illustrates the second implantation step wherein the PMOS transistors receive their first implantation. Photoresist layer 24 covers NMOS transistors 20 and 30 while exposing PMOS transistors 40 and 50. Transistor 40 is the high threshold voltage PMOS transistor. Transistor 50 is the low threshold voltage PMOS transistor. Initial source drain extension implant 14 extends the sources and the drains towards the gate. Source drain implant 14 is a p+ source drain implant. After source drain implant 14 is performed, halo implantation 19 is performed on the PMOS transistors. Implant 19 is an n halo implant. The n halo implant is performed at 0°–60° degrees off the normal of the surface of the integrated circuit.

Figure 3:
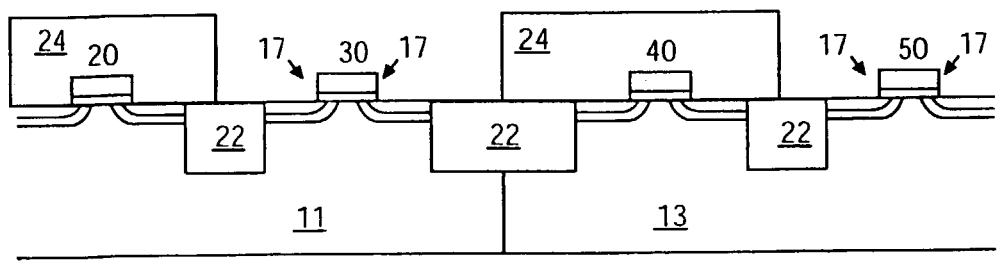
FIG. 3 is a schematic cross-sectional side view of one implantation operation for fabrication of an enhanced high threshold voltage NMOS transistor and a compensated low threshold voltage PMOS transistor.

FIG. 3 is an illustration of one embodiment of the third implantation which is a single halo implantation that both enhances the threshold voltage of high threshold voltage NMOS transistor 30, and compensates the threshold of low threshold voltage PMOS transistor 50. Halo implant 17 is a p− halo implant. The p− halo implant is performed at 0°–60° off the normal of the surface of the integrated circuit surface. Photoresist layer 24 covers low threshold voltage NMOS transistor 20 and high threshold voltage PMOS transistor 40.

The combination of p− halo implant of FIG. 1 and p− halo implant of FIG. 3 combine under high threshold voltage NMOS transistor 30 to produce a high threshold voltage. In this instance, the two halo implants combine their charge to enhance the threshold voltage of NMOS transistor 30. The combination of n halo implant of FIG. 2 and p− halo implant of FIG. 3 combine under low threshold voltage PMOS transistor 50 to produce a low threshold voltage. In this instance, the p− halo implant compensated part of the charge generated by the n halo implant. The n halo implant of FIG. 2 originally gave transistor 50 a high threshold voltage. The compensating charge provided by p− halo implant of FIG. 3 reduced the charge seen under the gate of transistor 50, creating a low threshold voltage PMOS transistor.

Figure 4:
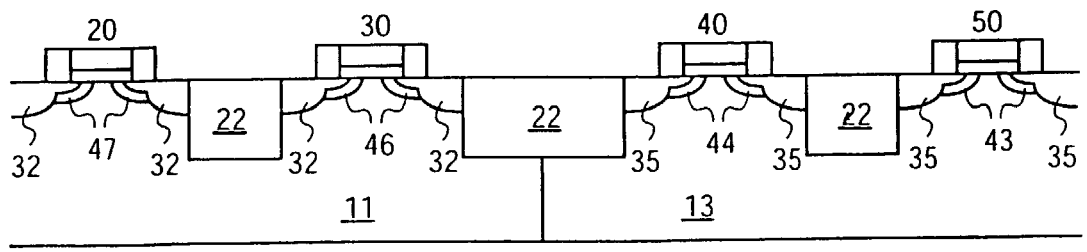
FIG. 4 is a schematic cross-sectional side view illustration of an embodiment of a dual threshold voltage CMOS circuit.

FIG. 4 shows the CMOS circuit transistors after spacer formation, source drain implant and implant activation anneal. Low threshold voltage NMOS transistor 20 is seen to have n+ source drain 32 on either side of the gate, and threshold voltage implant comprising a p− charge in implant regions 47. High threshold voltage NMOS transistor 30 is seen to have n+ source drain regions 32 on either side of the gate and threshold voltage implants comprising the summation of the p implant and the p− implant regions 46. High threshold voltage PMOS transistor 40 is seen to have p+ source drain regions 35 on either side of the gate, and n threshold voltage implantation regions 44. Low threshold voltage PMOS transistor 50 can be seen to have p+ region 35 on either side of the gate, for the source drain and the summation of the p− and n halo implant in threshold voltage implantation regions 43.

Figure 5:
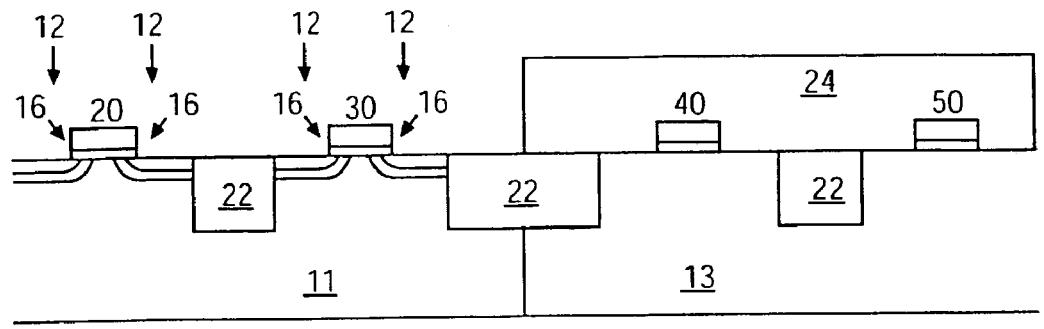
FIG. 5 is a schematic cross-sectional side view of one implantation operation for a high threshold voltage NMOS transistor.

Another embodiment of this implantation is shown in FIGS. 5–8. FIG. 5 illustrates the first implantation operation of the NMOS transistors 20 and 30 in p-well 11. Transistor 20 is the low threshold voltage NMOS transistor. Transistor 30 is the high threshold voltage NMOS transistor. PMOS transistors 40 and 50 in n-well 13 are isolated from the implantation by photoresist layer 24. Isolation layers 22 separate all of the transistors from one another. A photolithography process operation exposes transistors 20 and 30, which are both NMOS transistors, to implantation. An initial source drain extension implantation 12 is performed on all of the n-type transistors. Source drain implantation 12 is an n+ implantation. After source drain implantation 12 is performed, halo implantation 16 is performed on all of the exposed transistors. Halo implantation 16 is a p halo implantation. Halo implantation 16 is performed between 0°–60° off the normal of the integrated circuit surface.

Figure 6:
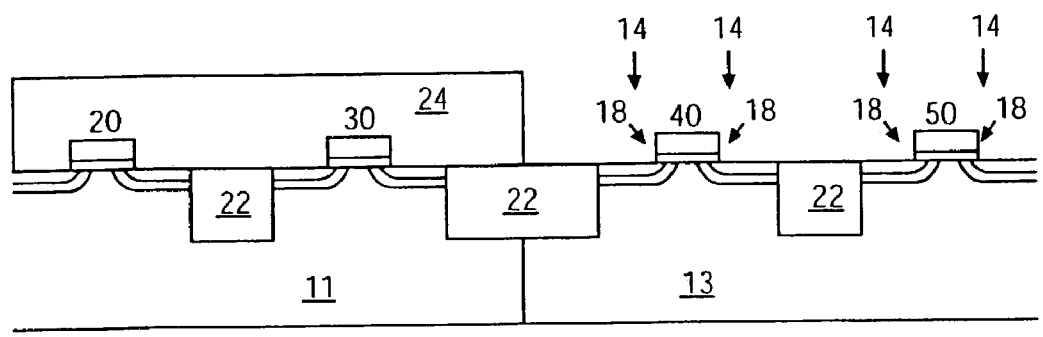
FIG. 6 is a schematic cross-sectional side view of one implantation operation for developing a low threshold voltage PMOS transistor.

FIG. 6 illustrates the second implantation step wherein the PMOS transistors receive their first implantation. Photoresist layer 24 covers NMOS transistors 20 and 30 while exposing PMOS transistors 40 and 50. Transistor 40 is the high threshold voltage PMOS transistor. Transistor 50 is the low threshold voltage PMOS transistor. Initial source drain extension implant 14 extends the sources and the drains towards the gate. Source drain implant 14 is a p+ source drain implant. After source drain implant 14 is performed, halo implantation 18 is performed on the PMOS transistors. Implant 18 is an n− halo implant. The n− halo implant is performed at 0°–60° degrees off the normal of the surface of the integrated circuit. The implantation is placed in the PMOS transistors 40 and 50 which are in n-well 13.

Figure 7:
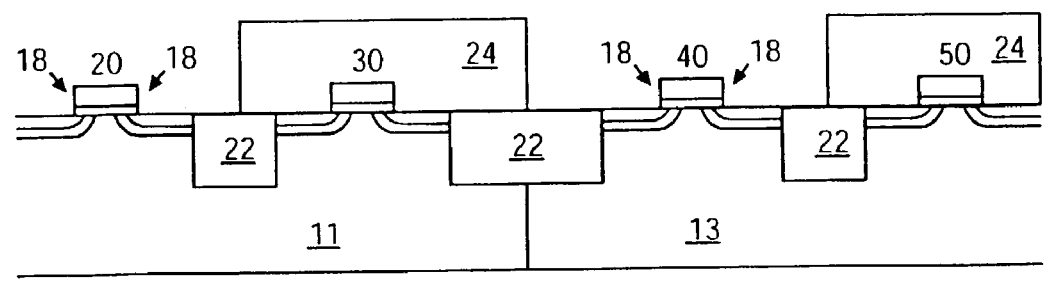
FIG. 7 is a schematic cross-sectional side view illustration of one implantation operation for enhancing the high threshold voltage PMOS transistor and compensating the low threshold NMOS transistor.

FIG. 7 is an illustration of one embodiment of the third implantation which is a single halo implantation that both compensates the threshold voltage of low threshold voltage NMOS transistor 20, and enhances the threshold voltage of high threshold voltage PMOS transistor 40. Halo implant 18 is an n− halo implant. The n− halo implant is performed at 0°–60° off the normal of the surface of the integrated circuit surface. Photoresist layer 24 covers high threshold voltage NMOS transistor 30 and low threshold voltage PMOS transistor 50.

The combination of p halo implant of FIG. 5 and n− halo implant of FIG. 7 combine under low threshold voltage NMOS transistor 20 to produce a low threshold voltage. In this instance, the n− halo implant compensated part of the charge generated by the p halo implant to reduce the threshold voltage of NMOS transistor 20. The combination of n− halo implant of FIG. 6 and n− halo implant of FIG. 7 combine under high threshold voltage PMOS transistor 40 to produce a high threshold voltage. In this instance, the second n− halo implant enhanced the first n− halo implant. The n− halo implant of FIG. 6 originally gave transistor 50 a low threshold voltage. The enhancing charge provided by n− halo implant of FIG. 7 enhanced the charge seen under the gate of transistor 40, creating a high threshold voltage PMOS transistor.

Figure 8:
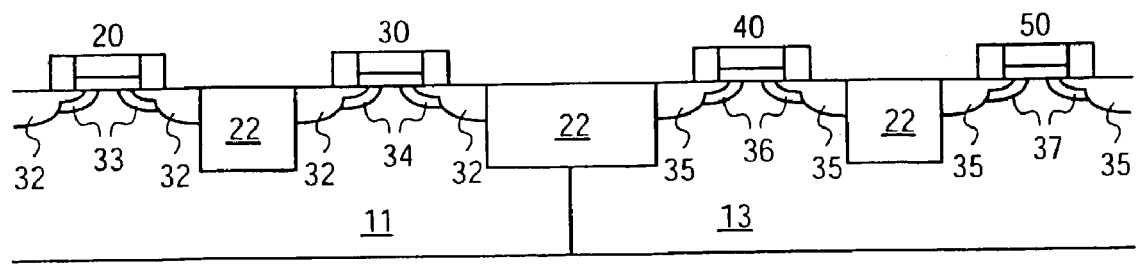
FIG. 8 is a schematic cross-sectional side view illustration of one embodiment of dual threshold voltage CMOS device.

FIG. 8 shows the CMOS circuit transistors after spacer formation, source drain implant and implant activation anneal. Low threshold voltage NMOS transistor 20 is seen to have n+ source drain regions 32 and threshold voltage implants comprising the summation of the p implant and the n− implant regions 33. High threshold voltage NMOS transistor 30 is seen to have n+ source drain regions 32 and p threshold voltage implant regions 34. High threshold voltage PMOS transistor 40 is seen to have p+ source drain regions 35 and n− plus n− threshold voltage implantation regions 36. Low threshold voltage PMOS transistor 50 can be seen to have p+ regions 35 for the source drain and n− threshold voltage implantation regions 37.

Figure 9:
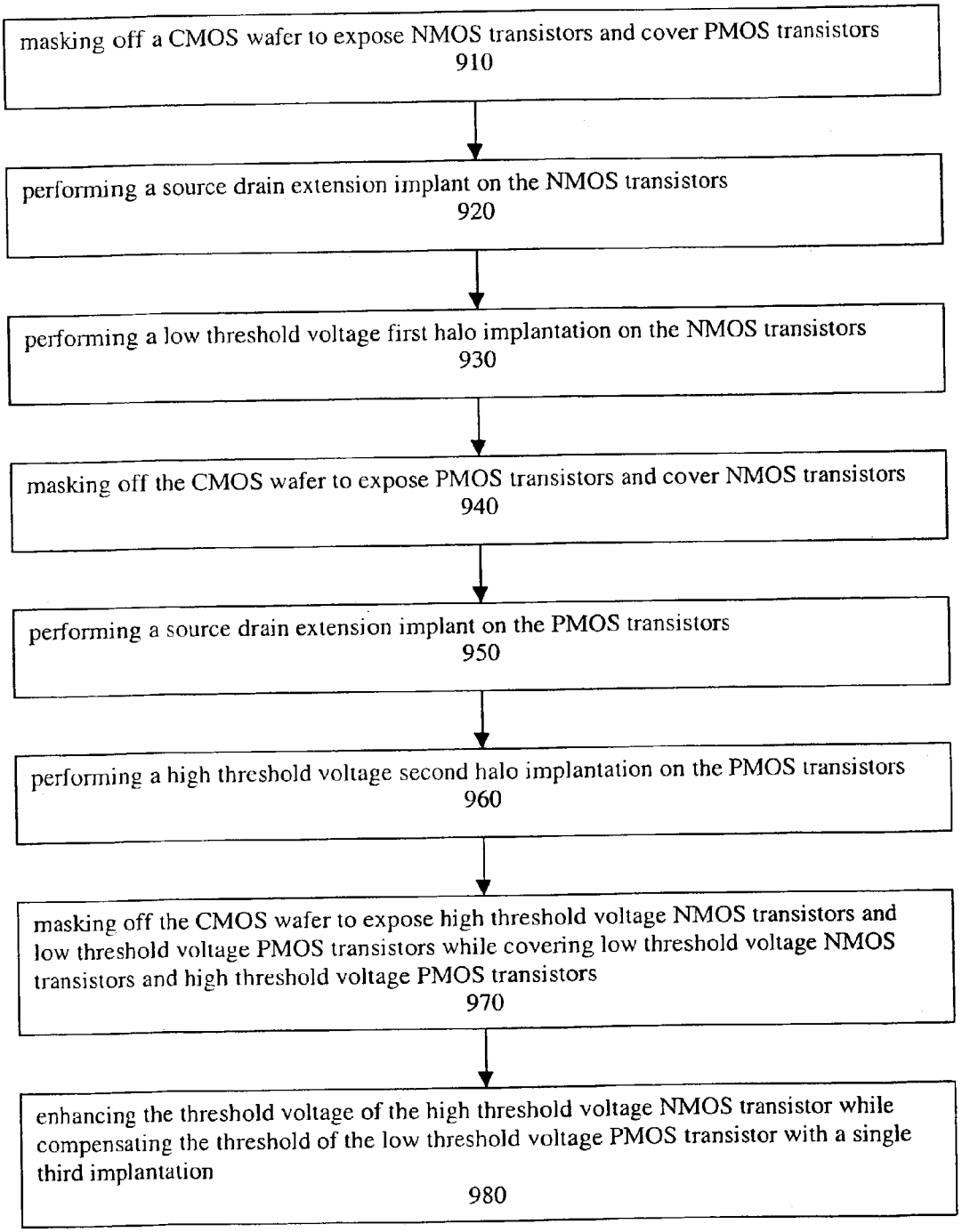
FIG. 9 is a flow chart demonstrating one embodiment of forming the dual threshold voltage CMOS device.

FIG. 9 is a flow chart showing one method of fabricating the dual threshold voltage CMOS integrated circuit of the claims. The CMOS wafer is masked with photoresist. The photoresist is developed to expose the NMOS transistors while covering the PMOS transistors in block 910. A source drain extension is performed on the NMOS transistors in block 920. The source drain extension implant may be an $n^+$ SDE implant. A low threshold voltage halo implant is performed on the exposed NMOS transistors in block 930. This halo implant may be a $p^-$ halo implant.

The CMOS wafer is then masked off with a new photoresist layer as shown in block 940 of FIG. 9. The photoresist is developed to expose the PMOS transistors and cover the NMOS transistors. A source drain extension implant is performed on the exposed PMOS transistors in block 950. The source drain extension implant may be a $p^+$ SDE implant. A high threshold voltage halo implant is preformed on the exposed PMOS transistors in block 960. This halo implant may be an n halo implant.

The CMOS wafer is then masked off with a new photoresist layer as shown in block 970 of FIG. 9. This layer of photoresist is developed to expose the high threshold voltage NMOS transistor and the low threshold voltage PMOS transistor. The low threshold voltage NMOS transistor and the high threshold voltage PMOS transistor remain covered by the photoresist. A third halo implant enhances the threshold voltage of the exposed NMOS transistor, and compensates the threshold voltage of the exposed PMOS transistor as shown in block 980.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A method comprising:
   establishing a first threshold voltage for an NMOS transistor and a second different threshold voltage for a PMOS transistor in a CMOS circuit; and
   implanting to enhance the threshold voltage of the NMOS transistor and to compensate the threshold voltage of the PMOS transistor with a single masking operation and implant.

2. The method of claim 1, wherein establishing a first threshold voltage and second threshold voltage comprises implanting to set the threshold voltages with the implant, wherein the implant is a halo implant.

3. The method of claim 1, further comprising:
   establishing the first threshold voltage with the implant of one of the group consisting of boron and boron diflouride, wherein the implant is a halo implant.

4. The method of claim 1, further comprising:
   establishing the second threshold voltage the halo implant of one of the group consisting of arsenic, phosphorous and antimony, wherein the implant is a halo implant.

5. The method of claim 1, wherein the first threshold voltage of the NMOS transistor is enhanced, and the second threshold voltage of the PMOS transistor is compensated with a single halo implant of one of the group comprising boron and boron difluoride.

6. The method of claim 1, wherein the first threshold voltage NMOS transistor is enhanced, and the second threshold voltage of the PMOS transistor is compensated with a single halo implant of one of the group comprising arsenic, phosphorous and antimony.

* * * * *